United States Patent
Kato et al.

(10) Patent No.: US 8,846,496 B2
(45) Date of Patent: Sep. 30, 2014

(54) MANUFACTURING METHOD OF SINGLE CRYSTAL SEMICONDUCTOR FILM AND MANUFACTURING METHOD OF ELECTRODE

(75) Inventors: Sho Kato, Kanagawa (JP); Kazutaka Kuriki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 330 days.

(21) Appl. No.: 13/092,249

(22) Filed: Apr. 22, 2011

(65) Prior Publication Data

US 2011/0269301 A1 Nov. 3, 2011

(30) Foreign Application Priority Data

Apr. 28, 2010 (JP) ................... 2010-103372

(51) Int. Cl.
H01L 21/30 (2006.01)
H01L 21/46 (2006.01)
H01L 21/762 (2006.01)

(52) U.S. Cl.
CPC ................. H01L 21/76251 (2013.01)
USPC ........... 438/458; 438/507; 257/E21.09

(58) Field of Classification Search
USPC ............................................. 438/458
See application file for complete search history.

(56) References Cited

U.S. PATENT DOCUMENTS

| 4,582,559 | A | * | 4/1986 | Tanielian et al. | ......... 204/192.25 |
| 5,374,564 | A | | 12/1994 | Bruel | |
| 5,869,387 | A | | 2/1999 | Sato et al. | |
| 6,121,117 | A | | 9/2000 | Sato et al. | |
| 6,251,754 | B1 | | 6/2001 | Ohshima et al. | |
| 6,335,231 | B1 | | 1/2002 | Yamazaki et al. | |
| 6,534,380 | B1 | | 3/2003 | Yamauchi et al. | |
| 6,802,926 | B2 | * | 10/2004 | Mizutani et al. | .............. 156/247 |
| RE39,484 | E | | 2/2007 | Bruel | |

(Continued)

FOREIGN PATENT DOCUMENTS

| EP | 0 553 852 A2 | 8/1993 |
| EP | 1 043 768 A1 | 10/2000 |

(Continued)

OTHER PUBLICATIONS

Dross.F et al., "Stress-Induced Lift-Off Method for kerf-loss-free wafering of ultra-thin (~50 μm) crystalline Si wafers,", Conference Record of the 33th IEEE PVSC (Photovoltaic Specialists Conference Confernece, 2008), May 11, 2008, pp. 1-5, IEEE.

*Primary Examiner* — Leonard Chang
(74) *Attorney, Agent, or Firm* — Nixon Peabody LLP; Jeffrey L. Costellia

(57) ABSTRACT

To provide a method of obtaining a single crystal semiconductor film by a method that is simple and low-cost. A single crystal semiconductor film 11 having compression stress is formed over a surface of a single crystal semiconductor substrate 10 by a vapor phase epitaxial growth method, a film having tensile stress (for example, a thermo-setting resin film 12) is formed over a surface of the single crystal semiconductor film 11, and the single crystal semiconductor substrate 10 and the single crystal semiconductor film 11 are separated from each other by a separation step in which force is applied to the single crystal semiconductor film 11, thereby obtaining a single crystal semiconductor film. Note that as the thermo-setting resin film 12, an epoxy resin film can be used, for example.

17 Claims, 4 Drawing Sheets

(56) References Cited

U.S. PATENT DOCUMENTS

| | | |
|---|---|---|
| 7,781,308 B2 | 8/2010 | Isaka et al. |
| 7,790,563 B2 | 9/2010 | Kakehata |
| 7,875,531 B2 * | 1/2011 | Dross et al. .................. 438/458 |
| 2005/0199279 A1 * | 9/2005 | Yoshimine et al. ........... 136/251 |
| 2009/0042362 A1 | 2/2009 | Moriwaka |
| 2009/0142879 A1 | 6/2009 | Isaka et al. |
| 2009/0142904 A1 | 6/2009 | Isaka et al. |
| 2009/0142908 A1 | 6/2009 | Isaka et al. |
| 2009/0197392 A1 | 8/2009 | Isaka et al. |
| 2009/0246937 A1 | 10/2009 | Yamazaki et al. |
| 2009/0261449 A1 | 10/2009 | Yamazaki et al. |
| 2009/0269875 A1 | 10/2009 | Kato et al. |
| 2009/0269906 A1 | 10/2009 | Kato et al. |
| 2010/0047952 A1 | 2/2010 | Ohnuma et al. |
| 2010/0081254 A1 * | 4/2010 | Shimomura et al. .......... 438/458 |
| 2010/0129948 A1 | 5/2010 | Isaka et al. |
| 2011/0124164 A1 | 5/2011 | Noda et al. |

FOREIGN PATENT DOCUMENTS

| | | |
|---|---|---|
| EP | 1 251 556 A1 | 10/2002 |
| JP | 05-211128 | 8/1993 |
| JP | 05-217821 | 8/1993 |
| JP | 09-260619 | 10/1997 |
| JP | 10-321548 | 12/1998 |
| JP | 10-093122 | 4/1999 |
| JP | 11-097379 | 4/1999 |
| JP | 2000-030993 | 1/2000 |
| JP | 2003-017671 | 1/2003 |

* cited by examiner

MANUFACTURING METHOD OF SINGLE CRYSTAL SEMICONDUCTOR FILM AND MANUFACTURING METHOD OF ELECTRODE

BACKGROUND OF THE INVENTION

1. Field of the Invention

A technical field of the present invention relates to a manufacturing method of a single crystal semiconductor film and an electrode that includes a separation step.

2. Description of the Related Art

As one manufacturing method of a single crystal semiconductor film, a hydrogen ion implantation separation method can be given. The hydrogen ion implantation separation method is a method of obtaining a single crystal semiconductor film by attaching to a support substrate a single crystal semiconductor substrate in which an embrittled region is formed by implanting hydrogen ions, and then separating the single crystal semiconductor substrate from the support substrate at the embrittled region by a heat treatment.

In Patent Document 1, a manufacturing method of an SOI (Silicon on Insulator) substrate using the hydrogen ion implantation separation method is suggested.

REFERENCE

Patent Document

[Patent Document 1] Japanese Published Patent Application No. 2004-87606

SUMMARY OF THE INVENTION

In the hydrogen ion implantation separation method, it is necessary to subject the single crystal semiconductor substrate to an ion implantation treatment in order to form the embrittled region. Accordingly, an apparatus for performing the ion implantation is needed, and it is also necessary to control acceleration energy and dose volume of hydrogen ions. Furthermore, damage to the single crystal semiconductor substrate cannot be ignored.

Also, in the hydrogen ion implantation separation method, it is necessary to perform the heat treatment at a relatively high temperature (300° C. or higher) in order to form a strong bond between the single crystal semiconductor substrate and the support substrate. Therefore, cost that comes with the heat treatment is high. Also, since the heat treatment is performed after attachment with the support substrate, it is difficult to use a substrate with low heat resistance such as an organic resin substrate as the support substrate. That is, it is difficult to form the single crystal semiconductor film over an organic resin substrate or the like using the hydrogen ion implantation separation method.

In view of this, an object is to provide a method of obtaining a single crystal semiconductor film by a method that is simple and low-cost which does not require an ion doping treatment or a heat treatment at a high temperature.

A purpose of the present invention is to laminate a film having compression stress and a film having tensile stress over a formation surface, and then separating the laminated structure from the formation surface. As more specific structures, the following can be given.

One mode of the present invention is a manufacturing method of a single crystal semiconductor film including steps of forming a single crystal semiconductor film having compression stress over a surface of a single crystal semiconductor substrate by a vapor phase epitaxial growth method; forming a film having tensile stress over a surface of the single crystal semiconductor film; and separating the single crystal semiconductor substrate and the single crystal semiconductor film from each other by a separation step in which force is applied to the single crystal semiconductor film.

Another mode of the present invention is a manufacturing method of a single crystal semiconductor film including steps of forming a single crystal semiconductor film having compression stress over a surface of a single crystal semiconductor substrate by a vapor phase epitaxial growth method; forming a film having tensile stress over a surface of the single crystal semiconductor film; sticking a film over a surface of the film having tensile stress; and separating the single crystal semiconductor substrate and the single crystal semiconductor film from each other by a separation step in which force is applied to the single crystal semiconductor film from above the film.

Another mode of the present invention is a manufacturing method of a single crystal semiconductor film including steps of forming a single crystal semiconductor film having compression stress over a surface of a single crystal semiconductor substrate by a vapor phase epitaxial growth method; forming a thermo-setting resin film (for example, an epoxy resin) over a surface of the single crystal semiconductor film; curing the thermo-setting resin film by heating to form a thermo-setting resin film having tensile stress; sticking a film over a surface of the cured thermo-setting resin film; and separating the single crystal semiconductor substrate and the single crystal semiconductor film from each other by a separation step in which force is applied to the single crystal semiconductor film from above the film.

In the above manufacturing method, there is a case in which a groove is formed in the film and the cured thermo-setting resin film before the separation step. Also, there is a case in which an epoxy resin film is used as the thermo-setting resin film.

Another mode of the present invention is a manufacturing method of a single crystal semiconductor film including steps of forming a single crystal semiconductor film having compression stress over a surface of a single crystal semiconductor substrate by a vapor phase epitaxial growth method; forming a thermo-setting resin (for example, an epoxy resin) film having a conductive property over a surface of the single crystal semiconductor film; curing the thermo-setting resin film by heating to form a thermo-setting resin film having tensile stress; sticking a film over a surface of the cured thermo-setting resin film; and separating the single crystal semiconductor substrate and the single crystal semiconductor film from each other by a separation step in which force is applied to the single crystal semiconductor film from above the film.

In the above manufacturing method, there is a case in which a groove is formed in the film and the cured thermo-setting resin film before the separation step. Also, there is a case in which an epoxy resin film is used as the thermo-setting resin film.

Another mode of the present invention is a manufacturing method of a single crystal semiconductor film including steps of forming a single crystal semiconductor film having compression stress over a surface of a single crystal semiconductor substrate by a vapor phase epitaxial growth method; forming a silver paste film over a surface of the single crystal semiconductor film; curing the silver paste film by heating to form a silver paste film having tensile stress; sticking a film over a surface of the cured silver paste film; and separating the single crystal semiconductor substrate and the single crystal semiconductor film from each other by a separation step in which force is applied to the single crystal semiconductor film from above the film. Note that here, as a matter of convenience, the expression "silver paste film" is also used even after the "paste" is cured.

Another mode of the present invention is a manufacturing method of a single crystal semiconductor film including steps of forming a single crystal semiconductor film having compression stress over a surface of a single crystal semiconductor substrate by a vapor phase epitaxial growth method; forming an ITO film over a surface of the single crystal semiconductor film; curing the ITO film by heating to form an ITO film having tensile stress; sticking a film over a surface of the cured ITO film; and separating the single crystal semiconductor substrate and the single crystal semiconductor film from each other by a separation step in which force is applied to the single crystal semiconductor film from above the film.

Note that by using the above-mentioned manufacturing method of a single crystal semiconductor film, an electrode such as a battery can be manufactured.

Since an ion doping treatment is not necessary for separating a single crystal semiconductor film, damage to a single crystal semiconductor substrate can be reduced. Also, a single crystal semiconductor film can be obtained just with a heat treatment at a low temperature. Therefore, a substrate with low heat resistance such as an organic resin substrate can be used as the support substrate, and a single crystal semiconductor film can be obtained at low cost.

DETAILED DESCRIPTION OF THE INVENTION

Embodiment 1

A manufacturing method of a single crystal semiconductor film will be described with reference to FIGS. 1A to 1E.

In this specification, "single crystal" refers to a crystalline solid in which a given crystal axis has the same orientation in all portions of a sample, when the given crystal axis is a focus of observation. However, those in which orientation of a crystal axis is different in some portions as well as those with lattice defect are also treated as single crystals.

In a first step, a surface of a single crystal semiconductor substrate 10 is cleaned to remove a natural oxide film (not shown in the figure). This is because if there is a natural oxide film at an interface of the single crystal semiconductor substrate 10, crystallinity by epitaxial growth is degraded in a subsequent second step.

As the single crystal semiconductor substrate 10, a single crystal semiconductor substrate formed using a Group 14 element such as a single crystal silicon substrate, a single crystal germanium substrate, or a single crystal silicon germanium substrate can be used.

To clean the surface of the single crystal semiconductor substrate 10, dilute hydrofluoric acid (DHF), sulfuric acid-hydrogen peroxide mixture (SPM), ammonia-peroxide mix (APM), hydrochloric-peroxide mix (HPM), or the like can be used.

Figure 1A:
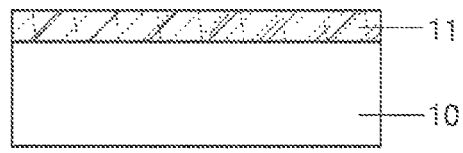
FIGS. 1A to 1E are pattern diagrams showing manufacturing steps of a single crystal semiconductor film.

In a second step, a single crystal semiconductor film 11 is formed over the surface of the single crystal semiconductor substrate 10 that is cleaned, by a vapor phase epitaxial growth method (see FIG. 1A). The single crystal semiconductor film 11 is desirably a film having compression stress. Alternatively, the single crystal semiconductor film 11 is desirably a film that shows compression stress by some sort of treatment (for example, a heat treatment). This is so that separation of the single crystal semiconductor film 11 which is done later can be performed without trouble.

As the vapor phase epitaxial growth method, a chemical vapor deposition (CVD) method can be selected.

A film thickness of the single crystal semiconductor film 11 may be appropriately selected as necessary. However, there is a correlation between the film thickness of the single crystal semiconductor film 11 and compression stress. Therefore, the thicker the film thickness of the single crystal semiconductor film 11, the higher the compression stress of the single crystal semiconductor film 11, and separation at an interface of the single crystal semiconductor substrate 10 and the single crystal semiconductor film 11 is made easier.

Figure 1B:
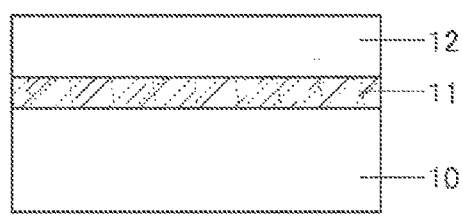

In a third step, a thermo-setting resin film 12 is formed over a surface of the single crystal semiconductor film 11 by a screen printing method (see FIG. 1B). As the thermo-setting resin film 12, an epoxy resin film can be used for example. Note that the thermo-setting resin film 12 is only one example of a film having tensile stress. Since a technological thought of the present invention that is disclosed is that separation of a semiconductor film having compression stress is made easy by forming a film having tensile stress over a surface of the semiconductor film having compression stress, it is needless to say that a film having tensile stress other than a thermo-setting resin film can be used as the film that is formed over the surface of the single crystal semiconductor film 11.

There is a positive correlation between the film thickness of the thermo-setting resin film 12 and heat stress due to temperature change. Accordingly, if the film thickness of the thermo-setting resin film 12 is thin, heat stress that occurs is weak, and a phenomenon may occur in a sixth step where the single crystal semiconductor film 11 does not separate from an interface with the single crystal semiconductor substrate 10 and only a film 13 is separated. Therefore, the thermo-setting resin film 12 needs to be formed with an appropriate film thickness. Note that there may be stress other than heat stress in the thermo-setting resin film 12. In this manner, it is needless to say that stress other than heat stress may be included as compression stress.

In a fourth step, the thermo-setting resin film 12 is cured by heating (not shown in the figure). A heating temperature in this case may be about 200° C.

Figure 1C:
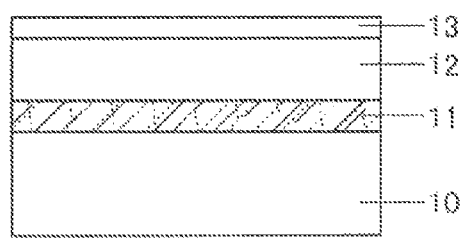

In a fifth step, the film 13 is stuck to a surface of the cured thermo-setting resin film 12 (see FIG. 1C). This is so that in breakage of the single crystal semiconductor film 11 can be prevented in a subsequent sixth step.

A material of the film 13 may be selected so that adhesion of an interface between the film 13 and the thermo-setting resin film 12 is stronger than adhesion of an interface between the single crystal semiconductor substrate 10 and the single crystal semiconductor film 11. For example, an organic material such as polyester, acrylic, or aramid can be used. Also, a material with a conductive property such as titanium may be used.

Figure 1D:
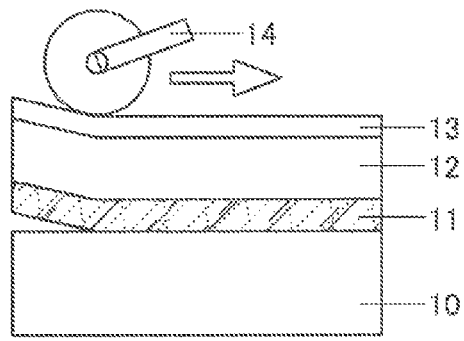

In the sixth step, force is applied evenly to the single crystal semiconductor film 11 from above the film 13 by a roller 14 to separate the single crystal semiconductor film 11 (see FIG. 1D). By applying force evenly to the single crystal semiconductor film 11, separation of the single crystal semiconductor film 11 at the interface with the single crystal semiconductor substrate 10 becomes easy.

In applying all-around even force to the single crystal semiconductor film 11 in a horizontal direction, a means other than the roller 14 may be used. Furthermore, if the single crystal semiconductor film 11 can be favorably separated, a method does not need to be limited to one in which even force is applied.

Before the sixth step, a shallow groove may be formed in the film 13 and the cured thermo-setting resin film 12 by scribing. By this scribing, separating in the sixth step becomes even easier.

Figure 1E:
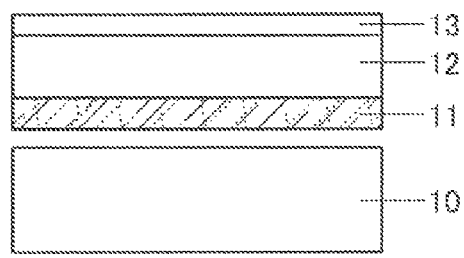

By the above steps, the single crystal semiconductor film 11 that is separated and transposed to the film 13 is obtained (see FIG. 1E).

The single crystal semiconductor film 11 obtained by the above steps is thin and bendable. Therefore, the single crystal semiconductor film 11 can be used for a flexible device.

Also, there is slight asperity on a surface of the single crystal semiconductor film 11 obtained by the above steps. Accordingly, favorable adhesion between the transposed film and a base material can be obtained.

The single crystal semiconductor substrate 10 after separation of the single crystal semiconductor film 11 can be reused after a regeneration treatment. For the regeneration treatment, a planarization treatment for planarizing a surface of the single crystal semiconductor substrate 10 and a heat treatment for reducing crystal defect of the single crystal semiconductor substrate 10 may be performed.

Embodiment 2

The single crystal semiconductor film 11 shown in Embodiment 1 can be used as a negative electrode of a lithium ion secondary battery or a negative electrode of a lithium ion capacitor.

Note that a third step, a fifth step, and a sixth step described in this embodiment correspond to the third step, the fifth step, and the sixth step described in Embodiment 1, respectively.

In the case of using the single crystal semiconductor film 11 as a negative electrode, it is necessary to give a conductive property to the thermo-setting resin film 12 in the third step by mixing a metal such as nickel (Ni) into a thermo-setting resin (for example, an epoxy resin).

Alternatively, in the third step, a silver paste film may be formed using a silver paste instead of a thermo-setting resin.

Further alternatively, in the third step, an indium oxide-tin oxide alloy (ITO) film may be formed by a sol-gel method instead of forming the thermo-setting resin film 12 by a screen printing method. In this case, a conductive property of the indium oxide-tin oxide alloy (ITO) film can be used.

Note that in the case of leaving behind the film 13, it is desirable to use as the film 13 a film having a conductive property such as a titanium film, in the fifth step.

In the case of using the single crystal semiconductor film 11 as a negative electrode, the thermo-setting resin film 12 that is given a conductive property or the like can be used as a current collector. Also for example, after separating the single crystal semiconductor film 11 in the sixth step, the single crystal semiconductor film 11 may be transposed to a current collector made of copper (Cu), titanium (Ti), or the like.

Alternatively, after sticking the film 13 in the fifth step, a copper sheet or the like may be stuck to a surface of the film 13 as a current collector. In this case, a laminated structure of a current collector, the film 13, the thermo-setting resin film 12 having a conductive property, and the single crystal semiconductor film 11 is formed.

Figure 2A:
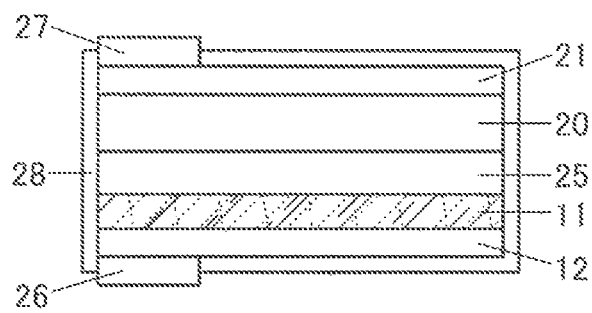
FIGS. 2A to 2C are each a pattern diagram showing a case of using a single crystal semiconductor film as a negative electrode of a lithium ion secondary battery.
Figure 2B:
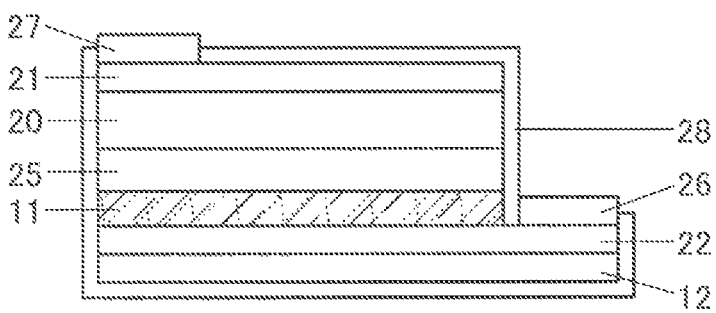
Figure 2C:
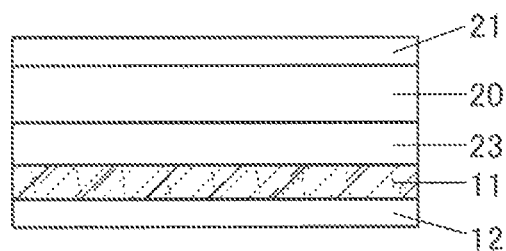

In FIGS. 2A to 2C, examples are shown of a structure of a lithium ion capacitor (or a lithium ion secondary battery) in which the above-described single crystal semiconductor film is used as a negative electrode.

FIG. 2A shows a structure in which the thermo-setting resin film 12 having a conductive property, the single crystal semiconductor film 11, a solid electrolyte 25, a positive electrode 20, and a current collector 21 are laminated. Here, an extraction electrode 26 and an extraction electrode 27 are connected to the thermo-setting resin film 12 having a conductive property and the current collector 21, respectively. Also, a protection film 28 is provided so as to cover portions except the extraction electrodes. Note that in this case, the film 13 is removed after the single crystal semiconductor film 11 is separated in the sixth step.

FIG. 2B shows a structure in which the thermo-setting resin film 12 having a conductive property, a current collector 22, the single crystal semiconductor film 11, the solid electrolyte 25, the positive electrode 20, and the current collector 21 are laminated. Also, the extraction electrode 26 and the extraction electrode 27 are connected to the current collector 22 and the current collector 21, respectively. Furthermore, the protection film 28 is provided so as to cover portions except the extraction electrodes. Note that when this structure is used, a conductive property is not a must for the thermo-setting resin film. Furthermore, in this case also, the film 13 is removed after the single crystal semiconductor film 11 is separated in the sixth step.

In a structure shown in FIG. 2B, the current collector 22 is provided between the single crystal semiconductor film 11 and the thermo-setting resin film 12. The current collector 22 is formed, for example, before forming the thermo-setting resin film 12 over the surface of the single crystal semiconductor film 11 in the third step. For the current collector 22, a metal film or the like formed by an evaporation method or a sputtering method may be used. Note that a material or the like of the current collector is not particularly limited as long as it is a material that can influence compression stress of the thermo-setting resin film to the single crystal semiconductor film 11 and can be used as a current collector of a negative electrode.

FIG. 2C shows a structure in which the thermo-setting resin film 12 having a conductive property, the single crystal semiconductor film 11, a separator 23, the positive electrode 20, and the current collector 21 are laminated. Here, an extraction electrode may be connected to each of the thermo-setting resin film 12 having a conductive property and the current collector 21. Also, a protection film may be provided. Furthermore, a negative electrode can for covering around the thermo-setting resin film 12 and the single crystal semiconductor film 11, and a positive electrode can for covering around the positive electrode 20 and the current collector 21 may be provided. For the negative electrode can and the positive electrode can, a material such as stainless steel can be used. Note that in this case also, the film 13 is removed after the single crystal semiconductor film 11 is separated in the sixth step.

Note that in the above, lithium iron phosphate (LiFePO$_4$) or the like can be used for the positive electrode 20; aluminum (Al) or the like can be used for the current collector 21; copper (Cu) or the like can be used for the current collector 22; and a resin material or the like can be used for the separator 23.

Embodiment 3

Figure 3:
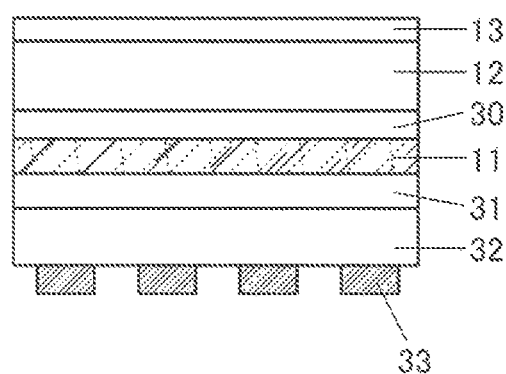
FIG. 3 is a pattern diagram showing a case of using a single crystal semiconductor film as a p-type substrate of a solar battery.

The single crystal semiconductor film 11 described in Embodiment 1 can be used as a p-type substrate for a solar battery. A structure thereof will be described with reference to FIG. 3.

Note that a second step, a third step, and a sixth step described in this embodiment correspond to the second step, the third step, and the sixth step described in Embodiment 1, respectively.

In the second step, the single crystal semiconductor substrate 10 that is p-type is used in order to obtain the single crystal semiconductor film 11 that is p-type. The single crystal semiconductor film 11 that is p-type is formed over the surface of the single crystal semiconductor substrate 10 that is p-type by a vapor phase epitaxial growth method.

In the third step, a metal film 30 is formed over the surface of the single crystal semiconductor film 11 by an evaporation method or a sputtering method before forming the thermosetting resin film 12. Note that a material or the like of the metal film 30 is not particularly limited as long as it is a material that can influence compression stress of the thermosetting resin film, with respect to the single crystal semiconductor film 11.

In the sixth step, after separating the single crystal semiconductor film 11, an amorphous silicon film 31 is formed over the surface of the single crystal semiconductor film 11 by an evaporation method or a sputtering method. The amorphous silicon film 31 is made to be i-type for example, so as to have a hetero junction with the single crystal semiconductor film 11.

After that, a semiconductor film 32 is formed over a surface of the amorphous silicon film 31 by an evaporation method or a sputtering method. For the semiconductor film 32, an n-type silicon (Si) film or an n-type zinc oxide (ZnO) film can be used.

Lastly, by forming a grid electrode 33 over a surface of the semiconductor film 32, a solar battery is completed.

In this manner, a solar battery using the single crystal semiconductor film 11 that is separated and transposed has an advantage that integration is easy.

Note that the single crystal semiconductor film 11 can be used as an n-type substrate for a solar battery. In this case, the single crystal semiconductor substrate 10 that is n-type is used. Also, for the semiconductor film 32, a p-type silicon (Si) film or a p-type zinc oxide (ZnO) film can be used.

Example

In this example, a result of measuring film stress of a single crystal semiconductor film and film stress of a film having tensile stress, under a condition in which favorable separation of the single crystal semiconductor film can be realized, is described. Note that the condition described in this example is only one example, and a mode of the present invention that is disclosed is not limited only to the condition described in this example.

A sample according to a measurement of this example was manufactured in the following manner: a single crystal silicon film with a thickness of about 500 nm was formed over a silicon wafer by a vapor phase epitaxial growth method, an epoxy resin film with a thickness of about 30 µm was formed as a film having tensile stress over the single crystal silicon film, and then a heat treatment (heating and curing of the epoxy resin film) at 200° C. was performed for 30 minutes.

Measurement of stress was performed in a state (a first state) in which the single crystal silicon film was formed over the silicon wafer, and in a state (a second state) after the epoxy resin film was formed over the single crystal silicon film and the epoxy resin film was cured. That is, in the first state, film stress of the single crystal silicon film was measured, and in the second state, film stress of a laminated state of the single crystal silicon film and the epoxy resin film was measured.

Measurement of stress was performed by measuring an amount of warpage due to stress. Specifically, measurement was performed by emitting laser light to a measurement surface and observing a state of reflected light thereof (reflection angle and the like). Also, in this example, amount of warpage in two directions, an x-direction and a y-direction, which are orthogonal to each other, was measured to perform stress measurement relating to the two directions in the surface. Note that before starting the measurement, the same measurement was performed on the silicon wafer, and with a state thereof as a standard, stress of each film was determined.

Figure 4:
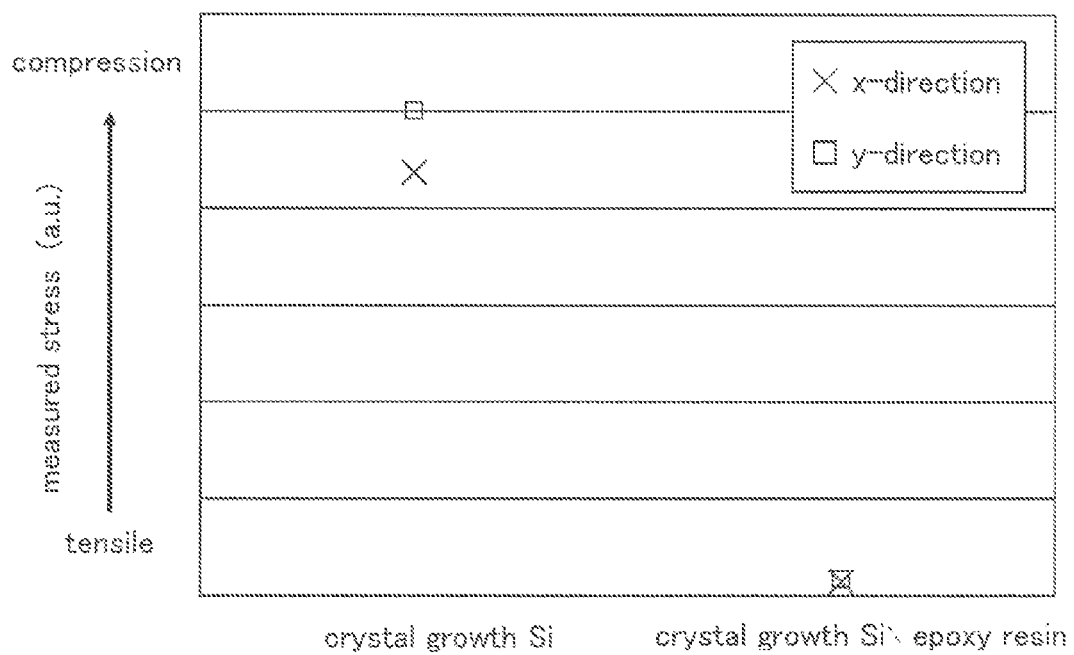
FIG. 4 shows a result of a stress measurement.

In FIG. 4, a result of the stress measurement is shown. In the figure, a horizontal axis represents either the single crystal silicon film (crystal growth Si) or a laminated film of the single crystal silicon film and the epoxy resin film (crystal growth Si\ epoxy resin), and a vertical axis represents the measured stress. Also, an "x" mark shows a measurement result relating to the x-direction, and a square mark shows a measurement result relating to the y-direction. Note that on the vertical axis, compression stress increases upwards.

It can be observed from FIG. 4 that, as opposed to the single crystal silicon film having relatively high compression stress, the laminated film of the single crystal silicon film and the epoxy resin film has weaker compression stress than the single crystal silicon film. This is because compression stress of the single crystal silicon film had been alleviated by tensile stress of the epoxy resin film.

In this manner, by forming a film having compression stress as the single crystal semiconductor film and then forming a film having tensile stress, favorable separation is realized. Although an absolute value of stress is not particularly limited, for example, with an absolute value of compression stress of the single crystal semiconductor film as a standard, separation that is sufficiently favorable can be realized if an absolute value of tensile stress of the film having tensile stress is 0.3 times or more and 3.0 time or less (preferably, 0.5 times or more and 2.0 times or less).

This application is based on Japanese Patent Application serial no. 2010-103372 filed with Japan Patent Office on Apr. 28, 2010, the entire contents of which are hereby incorporated by reference.

What is claimed is:

1. A manufacturing method of a single crystal semiconductor film comprising the steps of:
    forming a single crystal semiconductor film having compression stress over a surface of a single crystal semiconductor substrate by a vapor phase epitaxial growth method;
    forming a first film having tensile stress and electrical conductivity over a surface of the single crystal semiconductor film;
    sticking a second film over a surface of the first film having tensile stress; and
    separating the single crystal semiconductor substrate and the single crystal semiconductor film from each other by a separation step in which force is applied to the single crystal semiconductor film, wherein a groove is formed in the first film and the second film before the separation step.

2. The manufacturing method of a single crystal semiconductor film according to claim 1, wherein the step of separating is performed by a separation step in which force is applied to the single crystal semiconductor film from above the second film.

3. The manufacturing method of a single crystal semiconductor film according to claim 1,
wherein the method is applied to an electrode manufacturing.

4. The manufacturing method of a single crystal semiconductor film according to claim 1, further comprising:
forming a metal film on the single crystal semiconductor film before forming the film having tensile stress.

5. The manufacturing method of a single crystal semiconductor film according to claim 1,
wherein the method is applied to an electrode manufacturing, and
wherein the electrode manufacturing further comprises the step of forming a solid electrolyte or a separator in contact with the single crystal semiconductor film after the step of separating the single crystal semiconductor substrate and the single crystal semiconductor film from each other.

6. A manufacturing method of a single crystal semiconductor film comprising the steps of:
forming a single crystal semiconductor film having compression stress over a surface of a single crystal semiconductor substrate by a vapor phase epitaxial growth method;
forming a thermo-setting resin film having electrical conductivity over a surface of the single crystal semiconductor film;
curing the thermo-setting resin film by heating to form a thermo-setting resin film having tensile stress;
sticking a film over a surface of the cured thermo-setting resin film; and
separating the single crystal semiconductor substrate and the single crystal semiconductor film from each other by a separation step in which force is applied to the single crystal semiconductor film from above the film,
wherein a groove is formed in the film and the cured thermo-setting resin film before the separation step.

7. The manufacturing method of a single crystal semiconductor film according to claim 6, wherein the thermo-setting resin film is an epoxy resin film.

8. The manufacturing method of a single crystal semiconductor film according to claim 6,
wherein the method is applied to an electrode manufacturing.

9. The manufacturing method of a single crystal semiconductor film according to claim 6, further comprising:
forming a metal film on the single crystal semiconductor film before forming the thermo-setting resin film.

10. The manufacturing method of a single crystal semiconductor film according to claim 6,
wherein the method is applied to an electrode manufacturing, and
wherein the electrode manufacturing further comprises the step of forming a solid electrolyte or a separator in contact with the single crystal semiconductor film after the step of separating the single crystal semiconductor substrate and the single crystal semiconductor film from each other.

11. A manufacturing method of a single crystal semiconductor film comprising the steps of:
forming a single crystal semiconductor film having compression stress over a surface of a single crystal semiconductor substrate by a vapor phase epitaxial growth method;
forming a support film having electrical conductivity over a surface of the single crystal semiconductor film;
curing the support film by heating to form a support film having tensile stress;
sticking a film over a surface of the cured support film; and
separating the single crystal semiconductor substrate and the single crystal semiconductor film from each other by a separation step in which force is applied to the single crystal semiconductor film from above the film,
wherein a groove is formed in the film and the cured support film before the separation step.

12. The manufacturing method of a single crystal semiconductor film according to claim 11,
wherein the support film is a silver paste film.

13. The manufacturing method of a single crystal semiconductor film according to claim 11,
wherein the support film is an indium oxide-tin oxide alloy film.

14. The manufacturing method of a single crystal semiconductor film according to claim 11,
wherein the method is applied to an electrode manufacturing.

15. The manufacturing method of a single crystal semiconductor film according to claim 13,
wherein the method is applied to an electrode manufacturing.

16. The manufacturing method of a single crystal semiconductor film according to claim 11, further comprising:
forming a metal film on the single crystal semiconductor film before forming the support film.

17. The manufacturing method of a single crystal semiconductor film according to claim 11,
wherein the method is applied to an electrode manufacturing, and
wherein the electrode manufacturing further comprises the step of forming a solid electrolyte or a separator in contact with the single crystal semiconductor film after the step of separating the single crystal semiconductor substrate and the single crystal semiconductor film from each other.

* * * * *